(12) United States Patent
Kitahata

(10) Patent No.: US 6,329,699 B2
(45) Date of Patent: *Dec. 11, 2001

(54) BIPOLAR TRANSISTOR WITH TRENCHED-GROOVE ISOLATION REGIONS

(75) Inventor: Hideki Kitahata, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/045,794

(22) Filed: Mar. 23, 1998

(51) Int. Cl.[7] .................. H01L 27/082; H01L 29/00; H01L 27/102
(52) U.S. Cl. .................. 257/588; 257/514; 257/515; 257/517; 257/518; 257/587
(58) Field of Search .................. 257/565, 588, 257/587, 514, 515, 517, 518

(56) References Cited

U.S. PATENT DOCUMENTS

| | | | |
|---|---|---|---|
| 4,812,894 | * 3/1989 | Nakamura et al. | 257/588 |
| 5,128,740 | 7/1992 | Uchida et al. | 257/588 |

FOREIGN PATENT DOCUMENTS

| | | | |
|---|---|---|---|
| 59-215741 | 12/1984 | (JP) | 257/587 |
| 60-89969 | 5/1985 | (JP) | 257/588 |
| 63-72159 | 4/1988 | (JP) | 257/587 |
| 63-258067 | 10/1988 | (JP) | 257/588 |
| 63-266877 | 11/1988 | (JP) | 257/588 |
| 63-302559 | 12/1988 | (JP) | 257/588 |
| 1-232738 | 9/1989 | (JP) | 257/588 |
| 1-251658 | 10/1989 | (JP) | 257/588 |
| 2-12923 | 1/1990 | (JP) | 257/588 |
| 2-137233 | 5/1990 | (JP) | 257/588 |
| 3-155638 | 7/1991 | (JP) | 257/588 |
| 5-235012 | 3/1993 | (JP) | 257/588 |
| 6-318602 | 11/1994 | (JP) | 257/588 |

* cited by examiner

Primary Examiner—Steven Loke
(74) Attorney, Agent, or Firm—Foley & Lardner

(57) ABSTRACT

The invention relates to semiconductor devices having a bipolar transistor to form an isolation area within a base electrode contact area to ensure stable contact of the base electrode. The bipolar transistor formed in the transistor area is in the form of an island and is rectangular when view from above. The isolation area is formed of a dielectric material around the transistor area, and the base area is formed around the emitter area which forms the central area of the transistor area. A contact groove is formed at the inner interface of the isolation groove which faces the outer surface of the transistor area, and a part of the base electrode is buried in the contact groove and faces at least one of the upper surface of the transistor area and an inner surface of the contact groove.

9 Claims, 15 Drawing Sheets

BIPOLAR TRANSISTOR WITH TRENCHED-GROOVE ISOLATION REGIONS

BACKGROUND OF THE INVENTION

1. Field of the Invention

The present invention relates to the structures of semiconductor transistors and to fabrication processes therefor, particularly to those of bipolar transistors.

This application is based on Patent Application No. Hei 8-278321, filed in Japan, the contents of which are incorporated herein by reference.

2. Related Art

As is well known, reduction of transistor size in bipolar transistors is very effective for reducing parasitic capacitance from the standpoint of improving microwave performance thereof.

For reducing parasitic capacitance, it is very important to isolate transistors from one another.

Generally, in the case of fabrication of Si bipolar transistors on a Si substrate, local oxidation of Si(LOCOS) processes are used for isolation. However, this is not satisfactory due to problems related to the reduction of effective transistor areas and that of the open leads caused by the birds beak.

Here, another method for isolation, a trenched-groove isolation method, in which first, grooves such as trenched-grooves are formed, and then embedded using a dielectric material, is effective, since there is no problem due to the birds beak, unlike in the LOCOS process. Therefore, the trenched-groove isolation method is preferable to reduce the minimum transistor size due to the narrower isolation area and due to the possibility of building the isolation area near an active area of the transistor.

In particular, a method using dielectric materials such as BPSG (Boro-Phospho-Silicate-Glass), etc., which can exhibit "re-flow" characteristics at high temperatures, is effective for isolating transistors with reduced parasitic capacitances. In this description, the "re-flow" characteristics means to exhibits a flowability with changing the surrounding condition, that is increasing temperature, for example.

FIGS. 21 and 16 show a first related art, which are a schematic cross section and a plan view of a conventional bipolar transistor, respectively. The schematic cross section is the view from the line XXI—XXI in FIG. 16.

As shown in these figures, a bipolar transistor A is formed on the semiconductor substrate 1, within the transistor area B in the form of an island.

In this transistor area B, a highly-doped n-type semiconductor layer 2 (collector contact layer), lightly-doped n-type semiconductor layer 3 (collector layer), p-type semiconductor layer 12 (intrinsic base layer), and the upper surface, a highly-doped n-type semiconductor layer 15 (emitter layer) is formed; consequently, an npn-type bipolar transistor structure is produced. On the outside of the npn-type bipolar transistor structure, there exists a trenched-isolator 4, which electrically isolate between the transistors and other electrical elements from one another.

In addition, the field area is covered with oxide layer 5. On the upper oxide layer of the collector leading section 19, the base leading section 18, and the opening (contact hole) of the emitter leading section, there are through holes, each for respectively contacting these electrodes and the upper lead line. Here, the base electrode 9 is formed using a highly-doped p-type poly-silicon (poly-Si), whereas the emitter electrode 16 is formed using a highly-doped n-type poly-Si. As shown in this figure, a silicon-nitride layer 10 and a side wall structure formed using a dielectric layer 14 are inserted therebetween for isolation. In addition, the base electrode 9 is in contacted with the base layer at each end section of the base layer. On each end section, the doping concentration and the depth of the base layer is greater and thicker than that of the intrinsic base region. This highly-doped and thicker region is the so-called "graft-base layer" 13.

FIGS. 17 to 21 explain the fabrication process of the bipolar transistors. First, hidghly-doped n-type semiconductor layer 2, and lightly-doped n-type layer 3 were formed on a semiconductor substrate 1. Then, the trenched-groove isolation regions 4 were formed in the outer peripheral region which surround the transistor region. Next, oxide layer 5 is formed over the entire surface of the semiconductor substrate 1, then a base contact region 7 is formed by wet etching of the upper oxide layer at the opening region of the base contact region 7, by using a photoresist as a mask 6. The remaining oxide layer 5 is then etched using anisotropic dry etching, resulting in a complete opening through the base contact region 7.

After removing the photoresist mask 6, p-type poly-Si layer 9, by addition of a p-type impurity, is deposited on the entire substrate. The base electrode was formed by etching the poly-Si layer to a predetermined shape.

Next, a nitride layer 10 was deposited on the whole surface of the substrate 1 (FIG. 19). An opening for an emitter contact is then formed by using an anisotropic dry etching of both the nitride layer 10 and a highly-doped p-type poly-Si layer. The p-type intrinsic base layer 12 and a side-wall 14 formed by dielectric materials are then formed, resulting in isolation of the highly-doped poly-Si 9 from the base electrode. A highly-doped graft-base layer 13 is formed by diffusion of the p-type impurity in the highly-doped poly-Si 9 into the semiconductor layer by heat-treatment after deposition of the highly-(doped poly-Si 9.

Finally, an emitter electrode is formed using a highly-doped poly-Si 16 doped with an n-type impurity; a highly-doped n-type emitter layer 16 is then formed by diffusing an n-type impurity into the semiconductor layer originated form the highly-doped n-type poly-Si 16 during this heat treatment.

A second related art disclosed a structure with a minimized alignment margin region using a self-aligning process. This second process forms the contact region of the base electrode using a self-aligning technique. The fabrication process is as follows.

FIG. 27 and FIG. 22 show a cross section and a plan view of the self-aligned base electrode. In this structure, as the contact region of the base-electrode is determined at the emitter opening region in a self-aligned manner, no shift in alignment during the alignment process of opening the base contact is expected, so there will be no offset of the contact region of the base electrode, resulting in constant contact of the base electrode connected to the base contact region.

The fabrication process for the above self-aligned bipolar transistors will be explained with reference to FIGS. 23 to 27. In this self-aligned transistor, as in the conventional fabrication process as explained in the first related art, after completing the opening through the base contact region 7 and removing the photoresist mask, the base contact region is covered by about a 50-nm-thick spacer oxide Layer 8 grown using a thermal oxidation method. Next, p-type poly-Si is grown over the entire surface, followed by the processes to form a desired shape and covering the whole surface with nitride 10.

The opening of the emitter region is then formed using anisotropic dry etching of a nitride layer 10 and a highly-doped p-type poly-Si layer, and next, partial wet etching is performed to etch the spacer oxide layer 8 near the openings. After this, the substrate is covered with poly-Si which was embedded under the highly-doped poly-Si 9, under which the spacer oxide layer 8 was side-etched by previous wet etching.

Poly-Si layer 11 is then etched back using an isotropic dry etching; poly-Si can remain only under the highly-doped poly-Si layer 9 where the spacer oxide layer 8 was side-etched. Then, the p-type intrinsic base layer 12 is formed, and then dielectric side-wall 14 was formed in order to isolate the emitter electrode of the highly-doped p-type poly-Si 9 and a base electrode. A highly-doped grafted-base layer 13 is formed by heat treatment after connecting it to the semiconductor area via poly-Si 11. The heat treatment enhances the diffusion of the p-type impurity originally doped in the highly-doped poly-Si layer 9, into the semiconductor area via poly-Si 11.

Finally, an emitter electrode is formed using a highly-doped n-type poly-Si 16. The highly-doped n-type emitter layer 15 is formed by diffusion of the n-type impurity originating from the poly-Si 16 into the semiconductor layer by heat treatment.

Therefore, fabricated bipolar transistors can determine the width of the contact area of the base electrode with respect to the emitter opening region by using a self-aligning technique; there will be no shift of alignment when opening the base contact, and there will be no offset of the contact region of the base electrode, resulting in good contact of the base electrode.

Japanese Patent Application, First Publication, No. Sho 63-72159 discloses the third related art, which will be explained using FIGS. 28 and 29 thereof. In this structure, bipolar transistors are isolated using a trenched-groove 4, and the emitter area 8 and the base contact region 7 was self-aligned with respect to the isolation trench 4. As a result, the alignment margin can be reduced, resulting in a reduction of device size, which has a merit of easy fabrication for high-density integrated circuits.

However, in the above three related arts, there are some problems to be solved.

In the first related art, the photoresist mask 6 for the opening of the base contact 7 should be formed to the inside of the base contact 7 by about 0.3 micron, because the base contact 7 is considered to be generally shifted by about 0.3 microns with respect to the edge of the isolation trench 4 in the conventional alignment process.

In addition, when forming the opening of the emitter region, the emitter region should be formed to the inside of the base contact 7 by about 0.5 microns because the base contact 7 is considered to be generally shifted by about 0.3 microns with respect to the edge of the isolation trench 4 in the conventional alignment process to ensure that the base electrode contact width is larger than 0.2 microns, even if there exists a shift of the base contact region 17 in the same direction of the above shift in alignment.

These problems presented a more difficult hurdle in reducing the transistor size, as the alignment margin area took up a larger proportion relative to the whole transistor area, thereby hindering further progress in device miniaturization.

In the second related art, the problem is that the alignment margin of the opening for the base contact 7 with respect to the edge of an isolation trench is not much improved. Only a 0.2 micron improvement is achieved over the above first related art because of lack of improvement in the alignment margin of the opening with respect to the edge of the isolation trench 4.

Furthermore, in the third related art, the problem remains of the formation of a large parasitic capacitance of poly-Si in the region around the collector region formed by the highly-doped n-type semiconductor layer 2 and the lightly-doped n-type semiconductor layer 3, because the highly-doped p-type poly-Si base electrode 9 was connected to the poly-Si in the trenched-groove, which will hinder an improvement in the microwave performance of transistors. As the poly-Si buried in the trenched-groove 4 itself does not exhibit conductivity, it does not function as a base electrode up to the bottom of the trenched-groove 4.

However, as the impurities in the highly-doped p-type poly-Si base electrode 9 can easily diffuse into the poly-Si in the trenched-groove 4, the region functioning as a base electrode is unnecessarily spread over a large area, resulting in increased capacitances between the base and the collector, as well as between the base and the substrate. Moreover, in the bottom portion of the trenched-groove 4, which does not function as abase electrode, the poly-Si functions as a capacitor between the collector and the substrate, introducing the problem of formation of large capacitance due to the high dielectric constant of poly-Si compared to the dielectric layer.

SUMMARY OF THE INVENTION

It is an object of the present invention to provide a structure and a fabrication process for the bipolar transistors with trenched-groove isolation regions, which can reduce the transistor area and parasitic capacitances to improve the microwave performance of the transistors, as well as the formation of the stable and reliable extraction of the base when the isolation region is formed at the location of contact region of the base electrode.

In order to achieve this object, the semiconductor device according to a first aspect of the present invention comprises a bipolar transistor formed in the transistor area in the form of an island which is rectangular when viewed from above, in which, the isolation area is formed with dielectric materials around the outside of the transistor area, and the base area is formed around the emitter area which is formed at the central area of the transistor area, in which there is formed a contact groove at the inner interface of the isolation groove which faces the outer surface of the transistor area, and that a part of the base electrode is embedded in the contact groove and faces at least one of the upper surface of the transistor area and an inner surface of the contact groove.

In this bipolar transistor, the parasitic capacitance with respect to the substrate is reduced, resulting in improved microwave performance compared to that of bipolar transistors in which the isolation region is embedded, not with dielectric material, but with a poly-Si with a high dielectric constant. Furthermore, in the structure of this invention, as a portion of the base electrode is embedded into the contact groove, in which the base contact area is overlapped on the isolation area, which ensures electric contact of the base electrode on the base area both at the upper surface and the inner surface of the contact groove, in spite of any shift caused by alignment.

The semiconductor devices according to the second aspect of the present invention comprises a bipolar transistor formed in a transistor area in the form of an island which is rectangular when viewed from above, in which the trenched-groove embedded with a dielectric layer as an isolation area formed around the transistor area, and the base area is formed around the emitter area which is formed at the central area of the transistor area, in which there is formed a contact groove at the inner interface of the trenched-groove which faces around the outer surface of the transistor area, and that a part of the base electrode is embedded in the contact groove and faces at least one of the upper surface of the transistor area and an inner surface of the contact groove.

In this bipolar transistor, the parasitic capacitance with respect to the substrate is reduced, resulting in improved microwave performance, compared to that of the bipolar transistors in which the trenched-groove of the isolation region is embedded, not with a dielectric material, but with a poly-Si with a high dielectric constant. Furthermore, in the structure of this invention, as a portion of the base electrode is embedded in the contact groove, in which the base contact area overlaps the area of the trenched-groove, ensuring an electric contact of the base electrode to the base area both at the upper surface and the inner surface of the contact groove, in spite of any shift of alignment.

The fabrication process for semiconductor devices according to the third aspect of the present invention comprises a step for forming a transistor area of a bipolar transistor in the form of an island which is rectangular viewed from above; a step of forming an isolation area by embedding dielectric material around the transistor area, in a manner so that the upper surface is planer on the whole surface of the substrate; a step for forming an opening larger than the transistor area; a step for exposing an upper surface and an upper-outside of the transistor area in the form of an island, by etching the dielectric layer within the openings; a step for forming a contact groove in proximity of the interface between the transistor area and the dielectric area by etching the dielectric layer in the contact groove by a predetermined thickness; a step for depositing the base electrode contact to at least one of the upper surface and the upper-outside of the transistor area in the form of an island, with the contact groove, as well as simultaneously burying a portion of the base electrode into the contact groove.

It is easy to fabricate the bipolar transistor of the invention using this fabrication process.

The fabrication process for semiconductor devices according to the fourth aspect of the present invention comprises, a step for forming a transistor area of a bipolar transistor in the form of an island and which is rectangular when viewed from above; a step for forming trenched-groove around the transistor area for isolation by embedding dielectric material around the transistor area, in a manner so that the upper surface is planer on the whole surface of the substrate; a step for forming openings larger than the transistor area and smaller than the outside edge of the trenched-groove; a step for exposing an upper surface and an upper outside of the transistor area by etching the dielectric layer within the openings;

a step for forming a contact groove in proximity to the interface between the transistor area and the dielectric area within the openings by etching the dielectric layer in the contact groove by a predetermined thickness;

a step for depositing a base electrode contact with at least one of the upper surface and the upper-outside of the transistor area in the contact groove, as well as embedding a portion of the base electrode into the contact groove.

It is easy to fabricate the bipolar transistor of the invention using this fabrication process.

The bipolar transistor according to the fifth aspect of the present invention is formed so that a side-wall using a dielectric material is inserted between the outside of the transistor area and the base electrode in the bipolar transistors.

The side-wall structure prevents the short-circuiting between the outside of the transistor area and the base electrode.

The fabrication process for semiconductor devices according to the sixth aspect of the present invention comprises; a step for forming a transistor area of a bipolar transistor in the form of an island which is rectangular when viewed from above; a step for forming an isolation area by embedding dielectric material around the transistor area, in a manner so that the upper surface is planer on the whole surface of the substrate; a step for forming an opening larger than the transistor area; a step for exposing an upper surface and an upper-outside of the transistor area by etching the dielectric layer within the opening; a step for forming a contact groove in proximity of the interface between the transistor area and the dielectric area by etching the dielectric layer in the contact groove by a predetermined thickness; a step for depositing an oxide layer selectively at the upper surface and the upper-outside of the transistor area; a step for depositing the base electrode in the contact groove; a step for forming a second opening for the formation of the emitter area within the surface of the base electrode;

a step for forming the second gap between the base electrode and the transistor area by etching the oxide layer isotopically, which is deposited on the upper surface and the upper outside of the transistor area; and a step for embedding the said second gap in a poly-Si layer so as to electrically contact the base electrode and the transistor area.

In the structure formed using this fabrication process, the base electrode does not contact the outside of the transistor area, since the contact width of the base electrode is self-aligned and is determined by the connection with the width of the side-etching of the oxide layer.

The fabrication process for semiconductor devices according to the seventh aspect of the present invention comprises a step for forming a transistor area of a bipolar transistor in the form of an island which is rectangular when viewed from above, a step for forming a trenched-groove around the transistor area for isolation by embedding dielectric material around the transistor area, in a manner so that the upper surface is planer on the whole surface of the substrate; a step for forming the openings larger than the transistor area and smaller than the trenched-groove; a step for exposing an upper surface and an upper-outside of the transistor area by etching the dielectric layer within the opening; a step for forming a contact groove in proximity of the interface between the transistor area and the dielectric area within the openings by etching the dielectric layer within the contact groove by a predetermined thickness; a step for depositing a base electrode contact to at least one of the upper surface and the upper-outside of the transistor area in the contact groove as well as embedding a portion of the base electrode into the contact groove; a step for depositing the base electrode in the contact groove; a step for forming a second opening for the formation of the emitter area within the surface of the base electrode; a step for forming the second gap between the base electrode and the transistor area by etching the oxide layer isotropically, which is deposited on the upper surface and the upper outside of the transistor area; and a step for burying the second gap by a poly-Si layer to contact to the base electrode and the transistor area electrically.

In the structure formed using this fabrication process, the base electrode does not contact the outside of the transistor area, since the contact width of the base electrode is self-aligned and is determined according to the width of the side-etching of the oxide layer.

The fabrication process according to the eighth aspect of the present invention comprises a step for forming an isolation area by embedding dielectric material which exhibits re-flow characteristics with increasing temperature.

The fabrication process according to the ninth aspect of the present invention comprises a step for forming an isolation area by embedding dielectric material made of BPSG.

The above two fabrication processes enable smoothing of the sharp step formed at the edge of the isolation area.

BRIEF DESCRIPTIONS OF THE DRAWINGS

DETAILED DESCRIPTION OF THE PREFERRED EMBODIMENTS

Referring now to FIGS. 1 to 7, a first embodiment of the bipolar transistor of the present invention will be explained.

Figure 1:
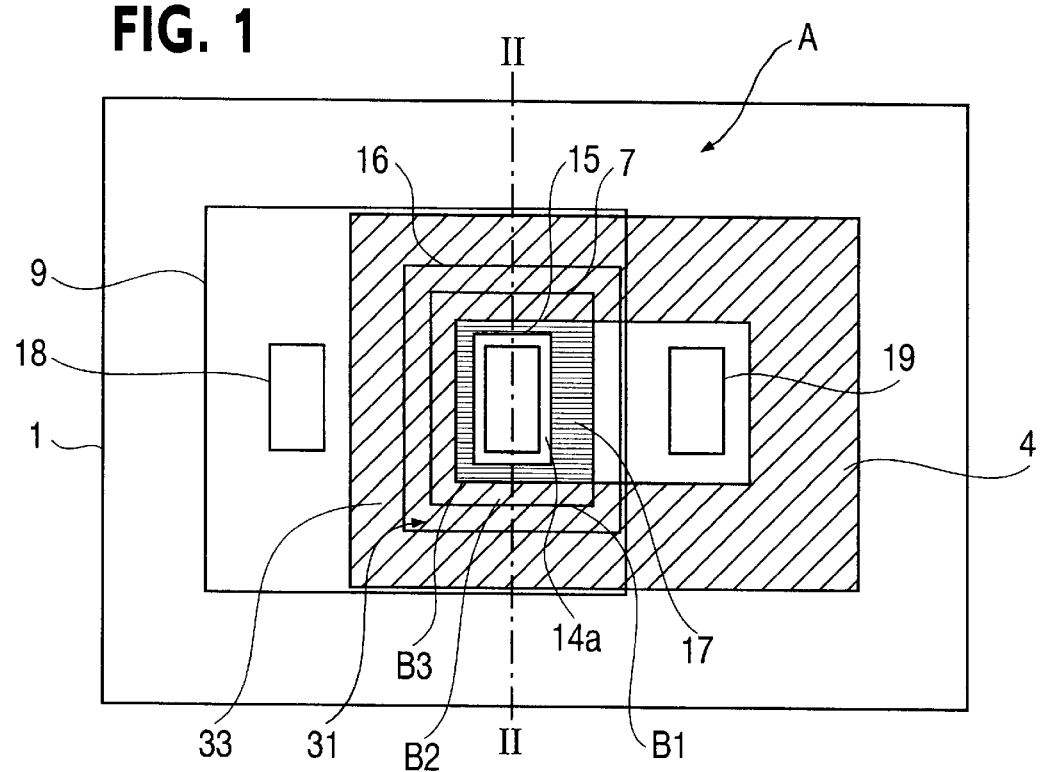
FIG. 1 is a plan view of a bipolar transistor according to the first embodiment of the present invention.
Figure 2:
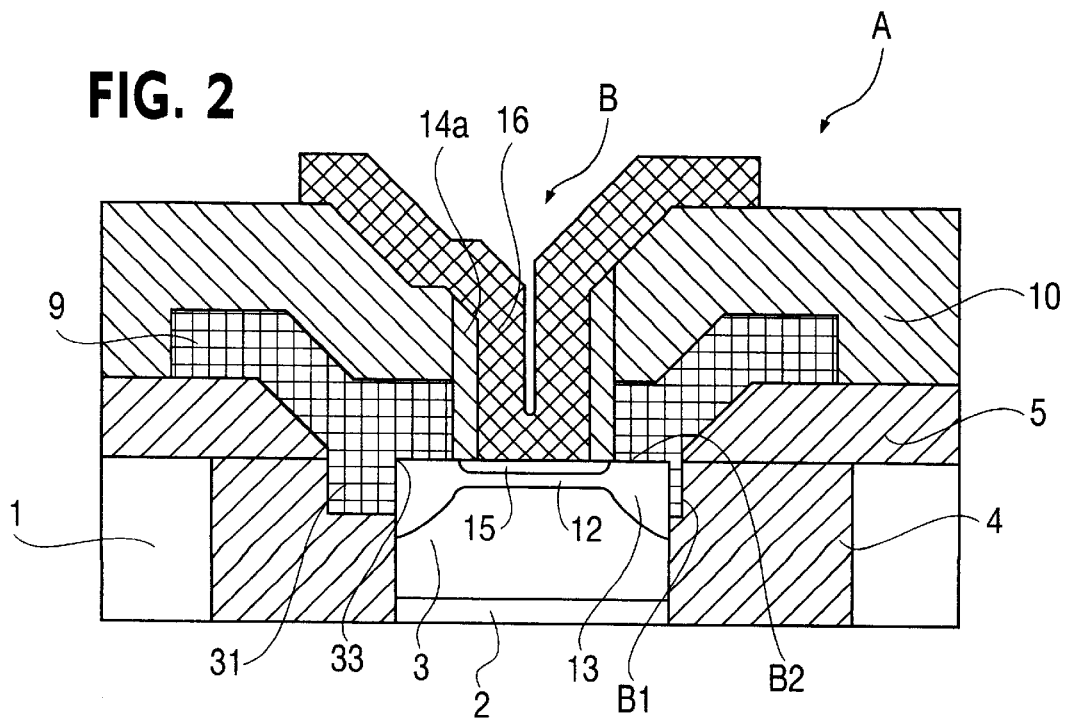
FIG. 2 is a cross section (along line II—II in FIG. 1) of a bipolar transistor according to the first embodiment of the present invention.

FIG. 1 is a plan view and FIG. 2 is a cross section of the transistor according to the first embodiment of the invention, in which is provided a semiconductor substrate 1. On the substrate, a transistor area B in the form of the island which is rectangular when viewed from above is disposed. Within the transistor area B, a bipolar transistor A is formed. An isolation area 4 is formed of a first dielectric layer 4a formed with SiO2. Furthermore, in the peripheral region B3 of the upper surface B2 of the transistor area B, abase layer 12 is formed surrounding the emitter layer 15 formed on the upper surface B2.

In addition to the above mentioned conventional-type transistor structure, the transistor A, according to the invention, is one in which contact groove 31 is formed within the isolation region 4 at around the contacting interface [4b] contacting the outside B1 of the transistor area B. The base electrode 9 is then embedded in the contact groove 31, in a manner so as to contact the upper surface B2 and outside B1, in the vicinity of the corner 33 formed by the upper surface B2 and outside B1.

Next, the fabrication process for the above-mentioned bipolar transistor is explained referring to FIGS. 3 to 7.

Figure 3:
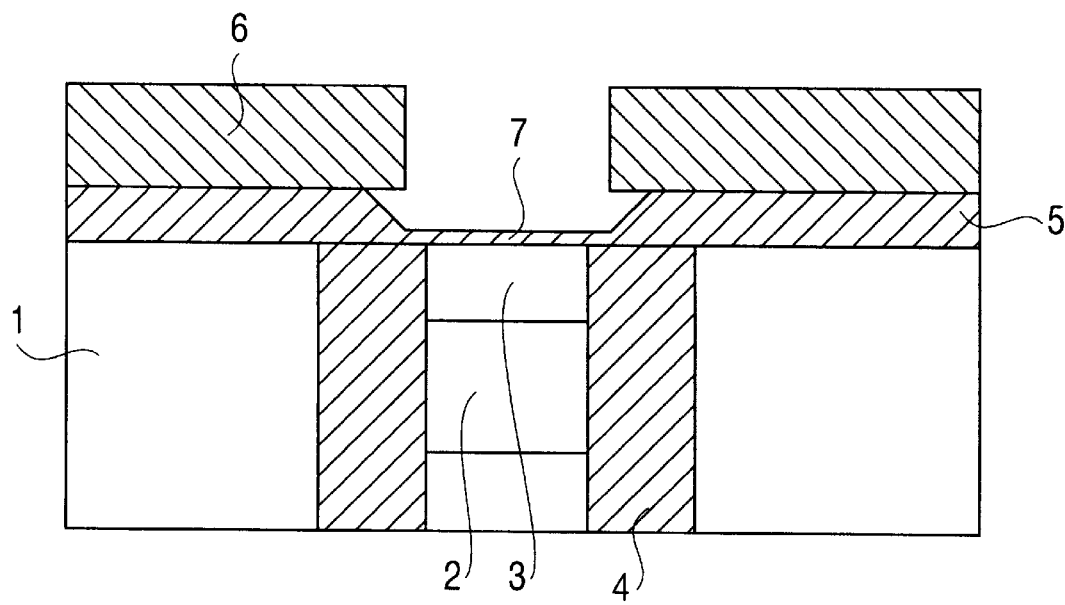
FIGS. 3 to 7 are cross sections showing a fabrication process of the bipolar transistor according to the first embodiment of the present invention.

As is shown in FIG. 3, transistor area B for bipolar transistor A, in the form of an island which is rectangular when viewed from above, is formed. Here, the stacked layer of a highly-doped n-type semiconductor layer 2 and a lightly-doped n-type semiconductor layer 3, is formed by using a epitaxial growth technique of lightly-doped n-type semiconductor layer 3 on the whole area of the substrate, after forming a highly-doped n-type semiconductor layer 2, by adding selectively, an n-type impurity on the predetermined area on the p-type semiconductor substrate 1.

The isolation trench 4 is then formed at the outside of the transistor area B, up to the level of the substrate 1. The isolation trench 4 is formed by selective etching of Si through the lightly-doped n-type semiconductor layer 3 and to reach the upper surface of the p-type semiconductor substrate 1, in order to form a groove to be embedded in a dielectric layer. For example, the depth of the groove is approximately 5 microns, the width is 1 micron. The dielectric layer used is, for example, BPSG which exhibits so called "re-flow" characteristics with increased temperature.

Thus, after the simultaneous growth of the dielectric layer using a low pressure CVD from both sides of the groove, the gap between the dielectric surface of the dielectric layers grown from each side of the groove is closed by the re-flow of BPSG. As the BPSG contains both highly-doped boron and phosphorus, they will act as a diffusion source when directly grown on the semiconductor. It should be noted that a device such as one concerned on the inner surface of the contact groove by a thermally-grown oxide layer or nitride layer, as the BPSG, will not contact the semiconductor layer directly.

Figure 4:
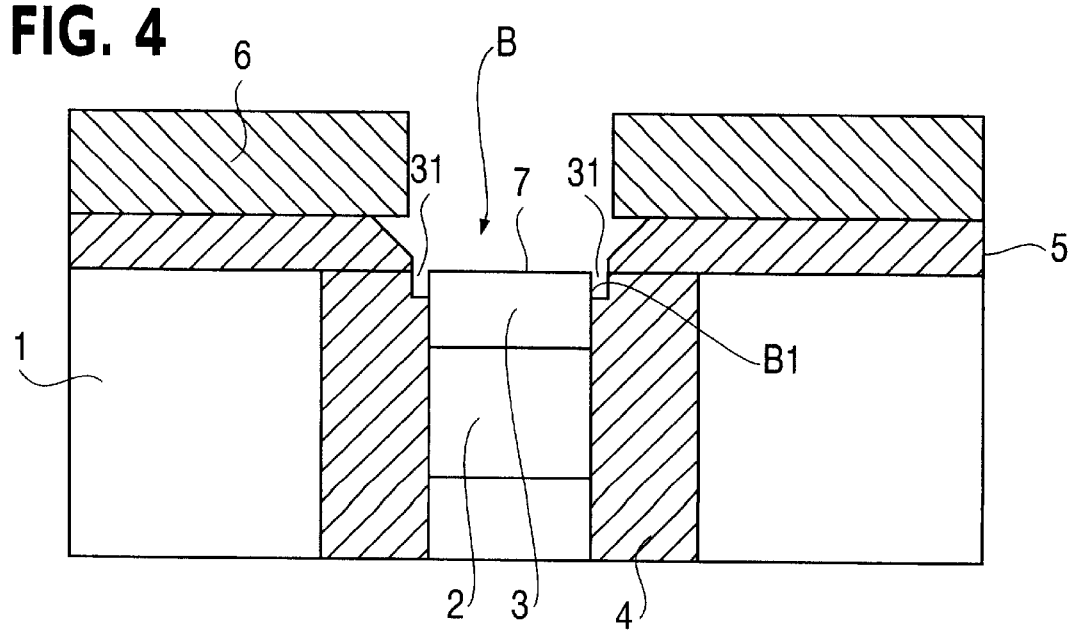

Furthermore, as shown in FIG. 4, after forming the second dielectric layer 5 over the entire surface of the semiconductor substrate 1, an opening larger than the transistor area B is formed for the base contact 7 using a photoresist as a mask 6. Then, the upper part of the transistor area B is exposed by eliminating the second dielectric layer 5 within the opening. Here, the photoresist mask 6 for use in the opening of the base contact is formed within the area where at least three edges of the rectangular semiconductor area, which has four edges surrounded by the isolation trench 4, are in the opening, by approximately 0.3 microns (denoted by reference numeral 7). The process for wet etching of the oxide layer 5 using a photoresist as a mask 6 for the purpose of slowing the edge of the opening of the base contact for easiness and ensure the following process. Therefore, the oxide layer 5 is sufficiently thick enough to etch the oxide layer 5 to a depth of more than half the entire thickness.

The opening is then formed by etching off the remaining oxide layer 5 using an anisotropic dry etching. At that time, the groove in the dielectric layer is formed with a depth of around 0.2 microns at the inside of the isolation trench, as well as exposing the edge of the semiconductor area A as shown in FIG. 4. In doing so, the upper surface B2 and the upper outside B1 of the transistor area B is exposed.

Furthermore, the dielectric layer 4a of the predetermined thickness, which is embedded into the gap formed between the opening and the edge of transistor area B, is etched off, forming a contact groove 31 at the area near to the interface of the transistor area B and the dielectric layer 4a.

Figure 5:
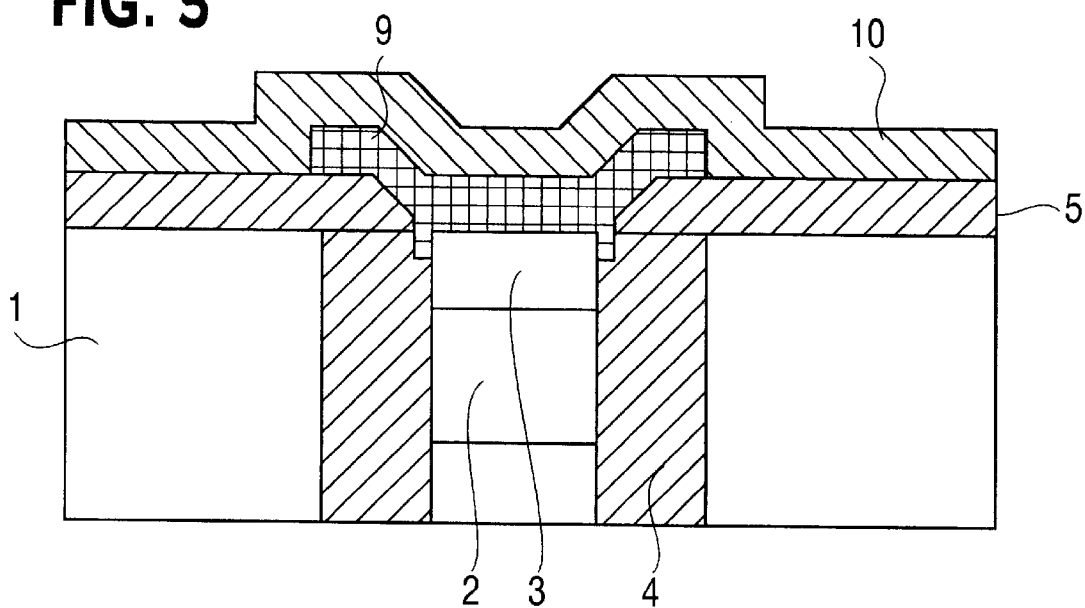

Next, as shown in FIG. 5, after etching the photoresist mask 6, highly-doped p-type poly-Si base electrode 9 was deposited over the entire surface of the substrate for simultaneously embedding the groove. After etching the base electrode 9 into a desired form, a silicon nitride layer 10 is deposited over the entire surface of the substrate.

Figure 6:
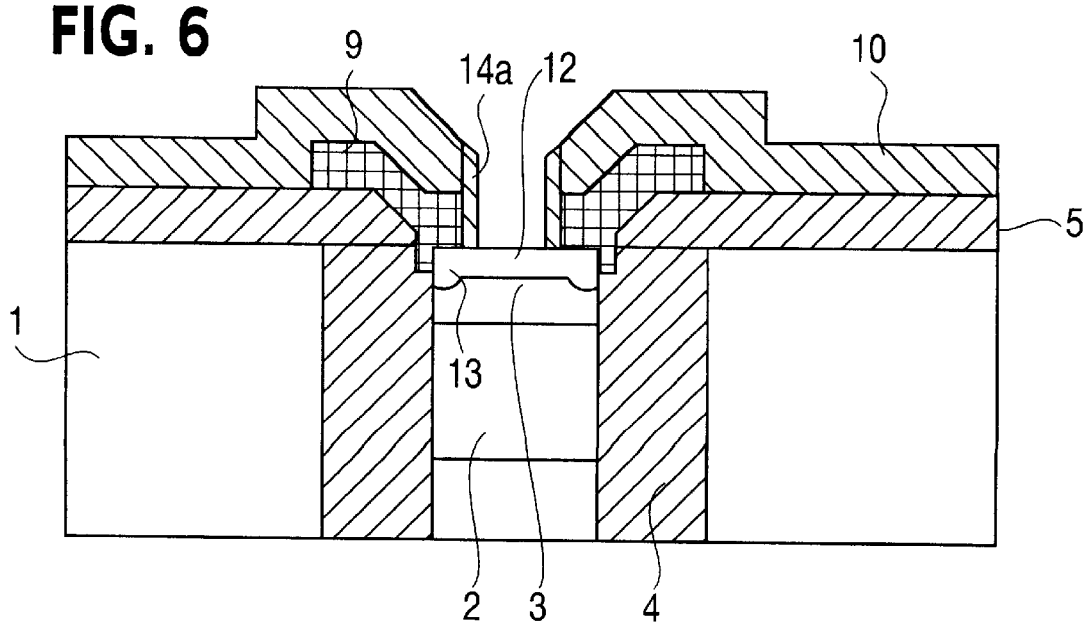

Next, as shown in FIG. 6, after etching the nitride layer 10 and the base electrode 9 within an opening for the formation of an emitter, the intrinsic base area 12 is formed by diffusing a dopant, and after depositing the third dielectric layer 14 (not shown), a side-wall 14a of a dielectric layer was formed using an anisotropic dry-etching method.

Here, the graft base layer 13 with a first conductive type (p-type in this case), is connected to the first conductive type poly-Si 9 as a base electrode and the first conductive type intrinsic base layer 12 by diffusing the first conductive-type impurity originated from the first conductive-type poly-Si 9 into the lightly-doped semiconductor layer 3 with a second conductive-type impurity (n-type in this case) by heat treatment after the growth of the first conductive-type poly-Si 9.

Figure 7:
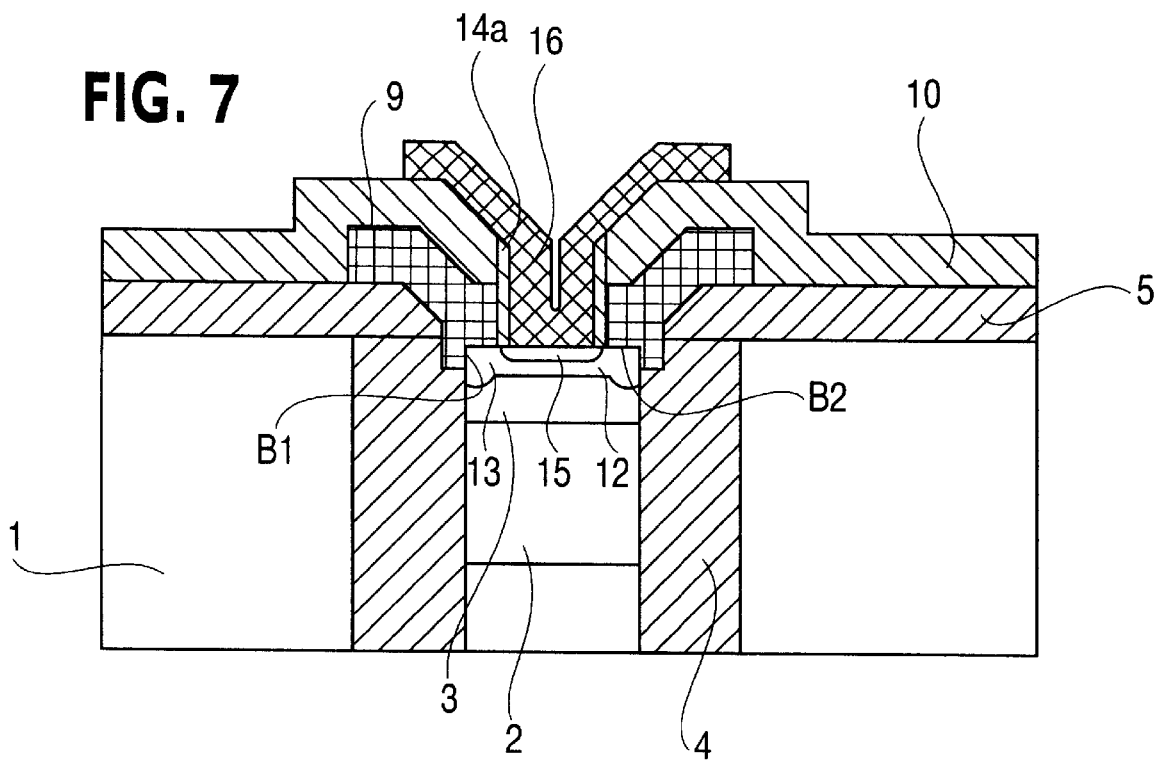

Lastly, as shown in FIG. 7, the emitter electrode was formed using a highly-doped impurity of the second conductive type poly-Si 16, then the second conductive-type emitter layer 15 was formed by diffusing the impurity of the second conductive-type from the poly-Si 16 into the intrinsic base layer 12 by heat treatment.

In this semiconductor device, the parasitic capacitance relative to the substrate was reduced, compared to the conventional structure with an isolation trench groove buried with a poly-Si which exhibits a high dielectric constant. Since the dielectric layer with a lower dielectric constant was embedded in that groove, which improved the microwave performance of the transistor. This improvement in microwave performance is more pronounced as the transistor size is reduced. Compared to that of the first related art, for example, the bottom area of the transistor for this invention is reduced by about 40%, and the total length around the transistor for this invention is reduced by about 20%, and therefore, the parasitic capacitance between the collector and the substrate is reduced by about 25%.

Furthermore, for the structure of this invention, as the base contact area was overlapped on the isolation trench and the contact groove was formed at the overlapping area within the groove of the isolation trench, the margin of the contact area of the base electrode is designed in the direction of the depth of the contact groove. Therefore, if an alignment shift in the direction parallel to the surface of the substrate occurs in the formation process of the base electrode, good contact will be ensured since the base electrode contacts both the upper surface and the outside of the semiconductor area. Thus, the necessary contact area will be satisfactory, since the contact at the side makes up for the loss of the contact area at the upper surface due to any shift of alignment.

Thus, the shift of alignment in the formation process of the opening affects the width of the highly-doped p type poly-Si 9 embedded in the contact groove of the isolation trench 4. However, as the depth of the contact groove is defined as the amount of over etching which was done in the process of the opening of the base contact area, so the contact area of the base electrode to the base layer is essentially constant, even if the shift of the alignment occurs. This constant contact area introduces a stable extracting of the base electrode from the stand-point of providing a constant contact resistance of the base electrode.

Next, the second embodiment of the present invention is explained with reference to FIGS. 8 to 14.

Figure 8:
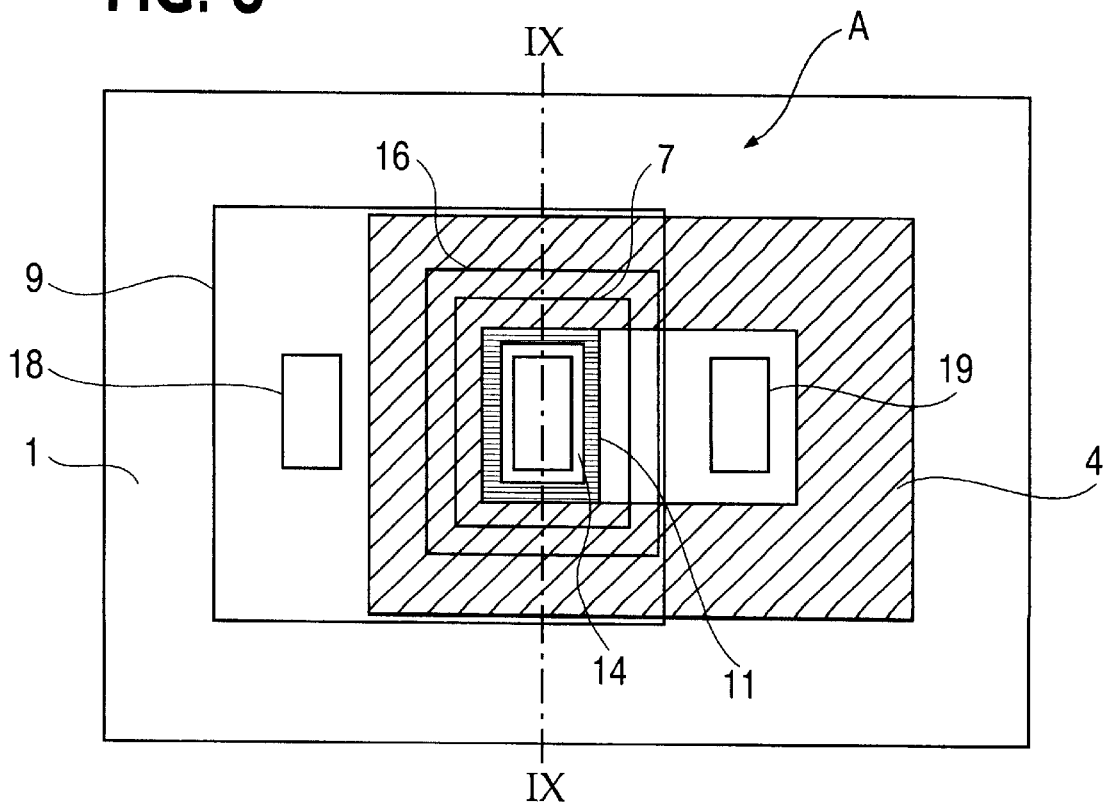
FIG. 8 is a plan view of a bipolar transistor according to the second embodiment of the present invention.
Figure 9:
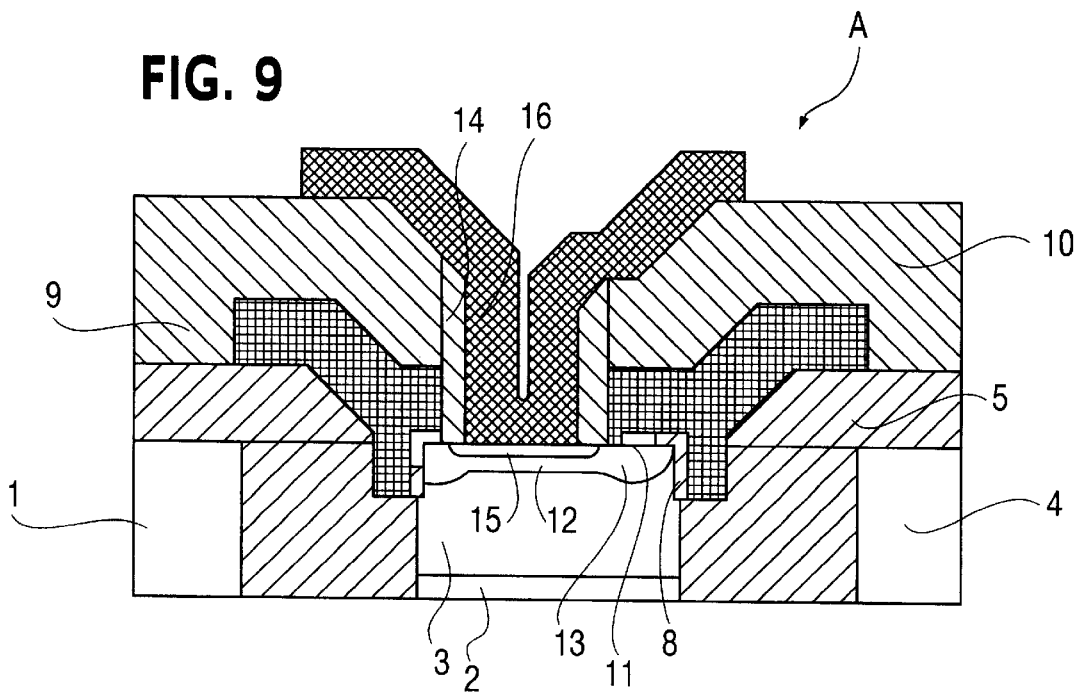
FIG. 9 is a cross section (along line IX—IX line in FIG. 8) of a bipolar transistor according to the second embodiment of the present invention.

FIG. 8 is a plan view of the semiconductor device 1 of this invention, and FIG. 9 is cross section of the device.

The second embodiment differs from the first embodiment in that the semiconductor device has a side-wall of dielectric 8 between the outside B1 of the transistor area B and the base electrode 9.

The fabrication process of the above semiconductor device is explained with reference to FIGS. 10 to 14.

Figure 10:
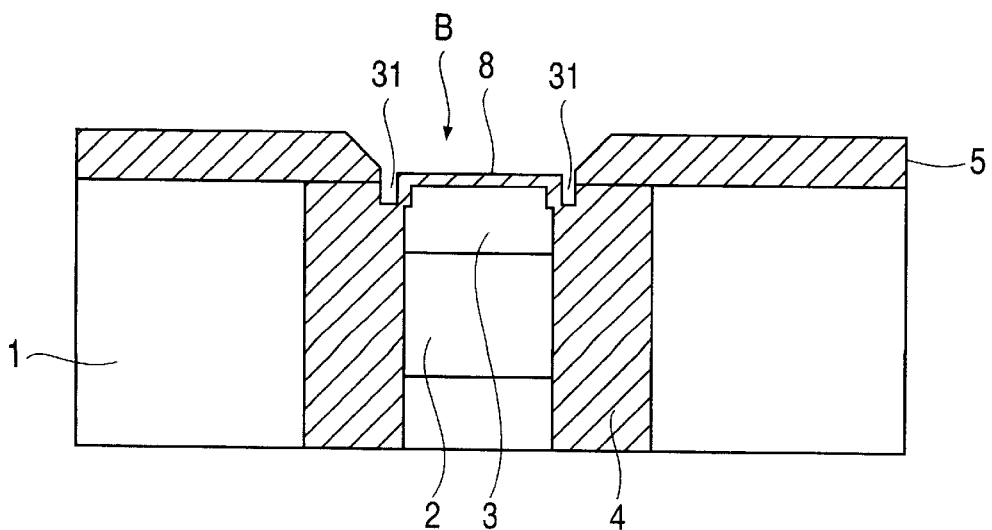
FIGS. 10 to 14 are cross sections showing a fabrication process of the bipolar transistor according to the first embodiment of the present invention.

As in the fabrication process of the semiconductor device in the first embodiment, after opening for the base contact 7, the remaining photoresist is removed, and as shown in FIG. 10, the semiconductor area within the base contact was covered with a spacer oxide 8 having a thickness of 20 nanometers to 100 nanometers by thermal oxidation of the entire surface of the substrate.

Figure 11:
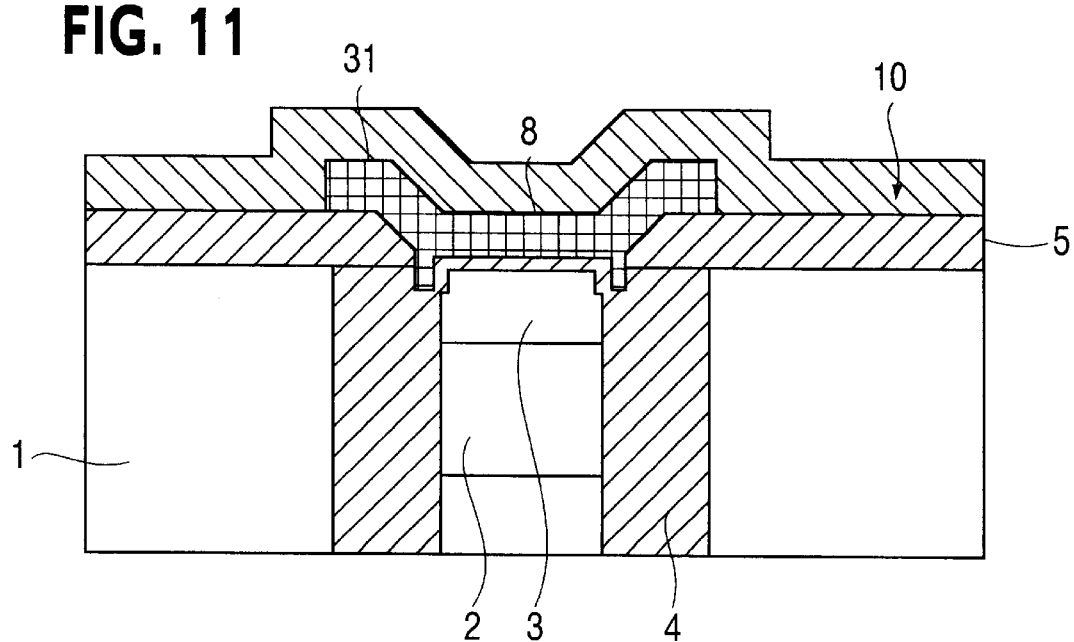

Then, as shown in FIG. 11, the poly-Si 9 of a first conductive-type, which will be a base electrode, is deposited on the entire surface of the substrate, etched to form a desired shape, and then covered with a dielectric nitride layer 10 over the entire surface of the substrate.

Next, after anisotropic etching of the dielectric layer 10 and a highly-doped p-type poly-Si 9 at the area for forming the emitter electrode, the dielectric oxide of the side-wall 8 is etched by the isotropic etching method. This isotropic etching is performed until the edge surface in the isolation trench of the side of the transistor area is exposed by side-etching of the oxide layer 8 under the poly-Si of the first conductive-type.

Figure 12:
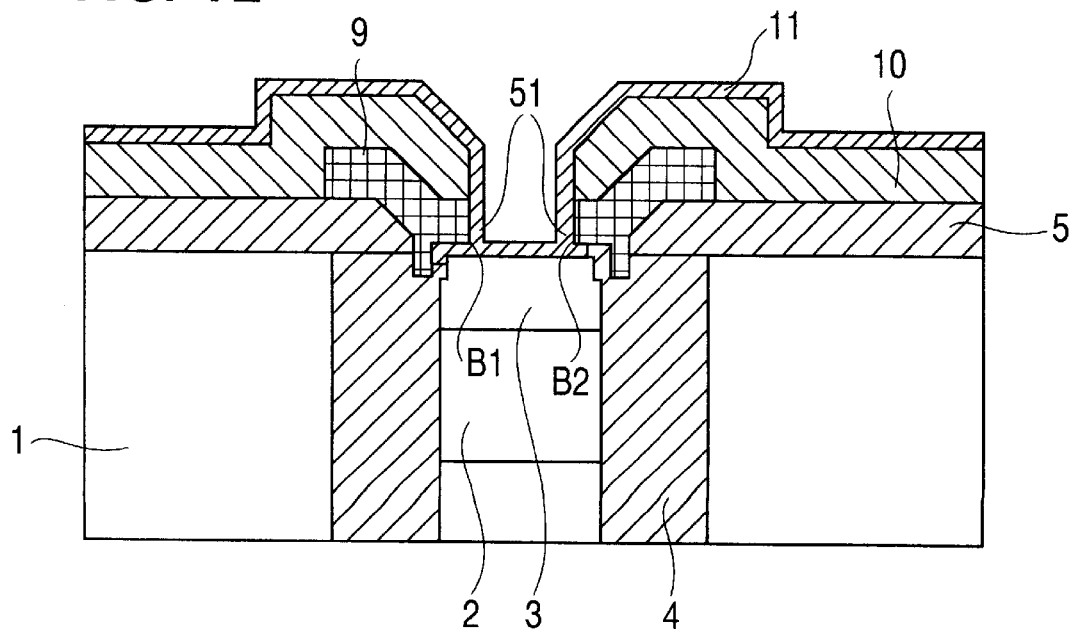

Next, as shown in FIG. 12, a poly-Si 11 is deposited over the entire surface of the substrate, the poly-Si 11 is embedded under the side-etched space 51, which is formed under the first conductive-type poly-Si 9 by side-etching of the oxide layer 8 under the poly-Si 9. After that, the poly-Si 11 remains only at the side-etched space 51 by using a etch-back method for poly-Si 11 using an isotropic etching method.

Figure 13:
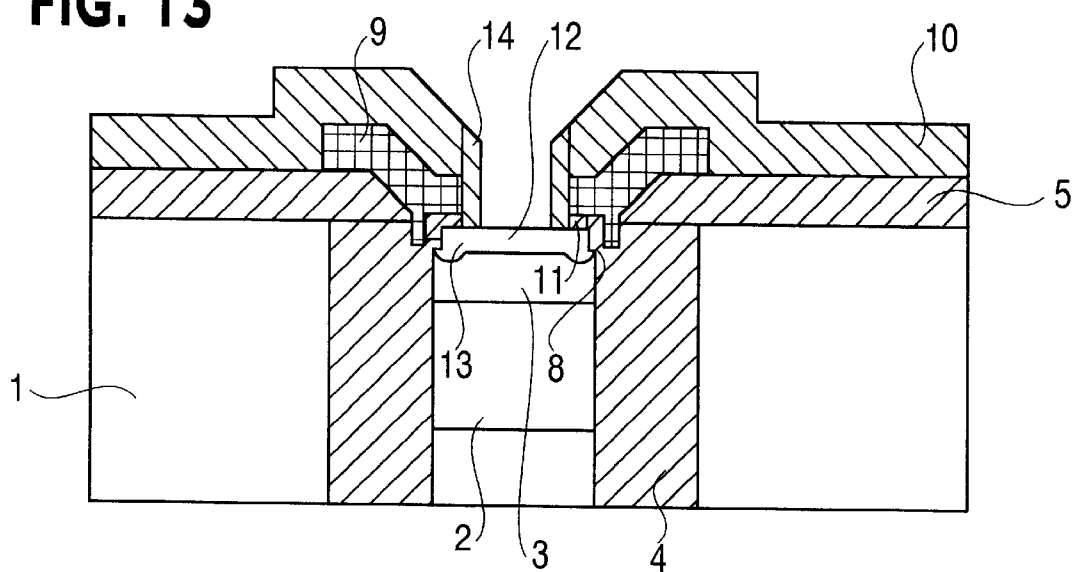

Next, as shown in FIG. 13, a first conductive intrinsic base 12 is formed, and then side-wall 14 of dielectric material is formed, which isolates the first conductive poly-Si 9 so as to be a base electrode. The first conductive graft-base layer 13 is then formed by diffusing the first conductive impurity originating from the first conductive poly-Si 9 into the semiconductor layer, caused by a heat treatment after the connection of the first conductive poly-Si 9 (to be a base electrode) and semiconductor area via; poly-Si 11.

Figure 14:
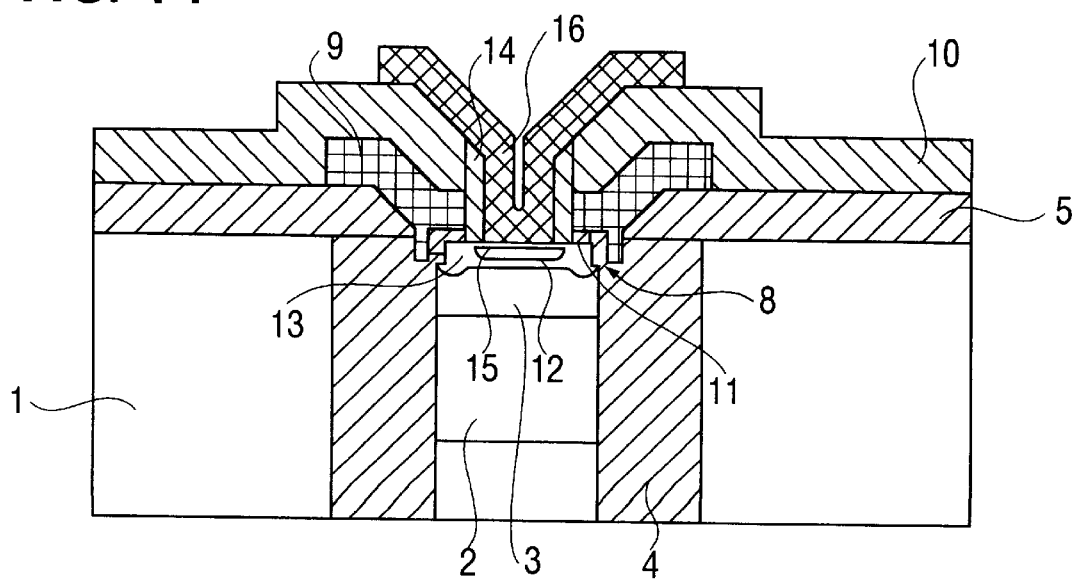

Lastly, as shown in FIG. 14, the emitter electrode is formed using a highly-doped poly-Si (to be an emitter electrode) of the second conductive impurity. Then, the second conductive emitter layer 15 is formed by diffusing the second conductive impurity originated from poly-Si 16 into the semiconductor area by heat treatment. In these semiconductor devices, as the side-wall dielectric layer is inserted between the outside and the base electrode, it is possible to prevent contact with the outer side and the base electrode.

FIG. 9 shows a cross section of the second embodiment shown in FIG. 14 assuming the occurrence of a shift in alignment in the process of an emitter opening, shown in FIG. 12, on the left side. Here, the shift of alignment of an opening process for an emitter affects the variation of the distance between the location of the emitter opening and the isolation trench 4. In the bipolar transistor according to the invention, the contacting width of the poly-Si 11 and the transistor area B is determined as a function of the amount of side-etching measured from the opening edge of the emitter area. Furthermore, said space oxide layer 8 is also formed at the side of the contact groove 31 in the isolation trench 4. After the etching of the spacer oxide 8 of the isolation trench 4, the etching proceeded in the direction of the depth of the layer, along the contact groove 31, by etching the highly-doped p-type poly-Si 9 embedded in the contact groove 31. Therefore, the amount of side-etching of the spacer oxide layer 8 is not restricted by the existence of the shift of distance between the location of the emitter opening and the isolation trench 4.

Therefore, in the embodiment shown in FIG. 9, poly-Si 11 is connected to both the side and the upper surface of the transistor area B on the left, and is connected to only the upper surface on the right of the transistor area B, the contact width which is proportional to the contact area of the base electrode to the base area, which is the sum of the upper surface and the side areas, will not be affected by the shift of alignment of the surface of the substrate, and a desired contact width of the base electrode both the on left and the right of the base electrode can be ensured.

In the bipolar transistor A formed in the above fabrication process, as the contact width of the base electrode can be determined by the self-alignment, no shift of the contact area of the base electrode will occur due to the shift of alignment in the opening process for the base contact. Furthermore, the contact width of the base electrode is determined in a self-aligning manner due to the amount of side-etching of the oxide layer 8, and it is therefore possible to precisely control the contact width of the base electrode, since it is possible to contact both the semiconductor surface and the side of the transistor in a self-aligned manner like the structures explained in the first embodiment.

In the first embodiment, the contact area of the base electrode does not vary due to the shift in alignment in the process for the opening of the base contact; however, there occurs an shift (imbalance) of the connection area of the base electrode due to the shift of alignment, toward the direction of the shift of alignment. In a different manner, in the transistor according to the second embodiment, the shift (imbalance) of the contacting area of the base electrode due to the shift of alignment in the process of the opening for the emitter can be prevented by embedding a part of the base electrode 9 into the contact groove 31 formed in the isolation trench 4 and by forming a spacer oxide 8 to cover the side of the semiconductor area.

Figure 15:
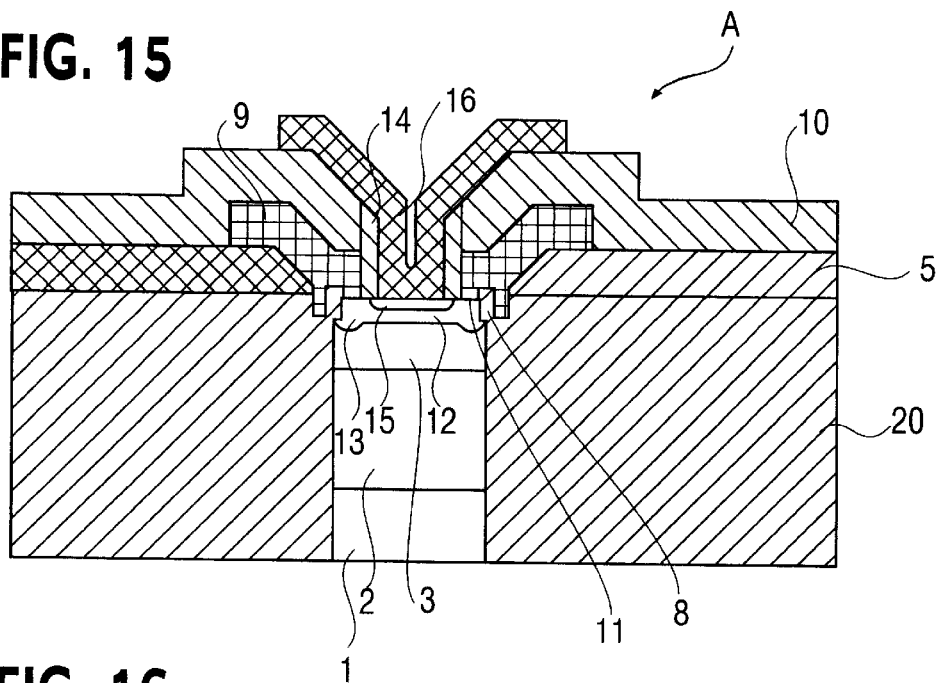
FIG. 15 is a cross section of a bipolar transistor according to the third embodiment of the present invention.
Figure 16:
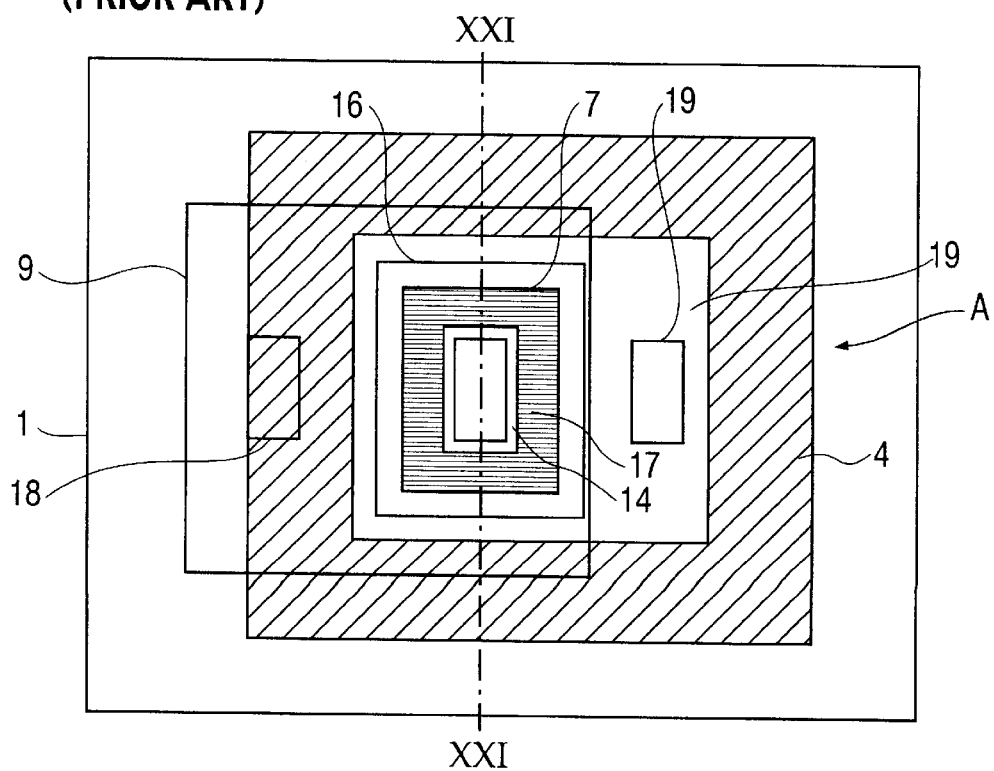
FIG. 16 is a plan view of a bipolar transistor according to the first related art.
Figure 17:
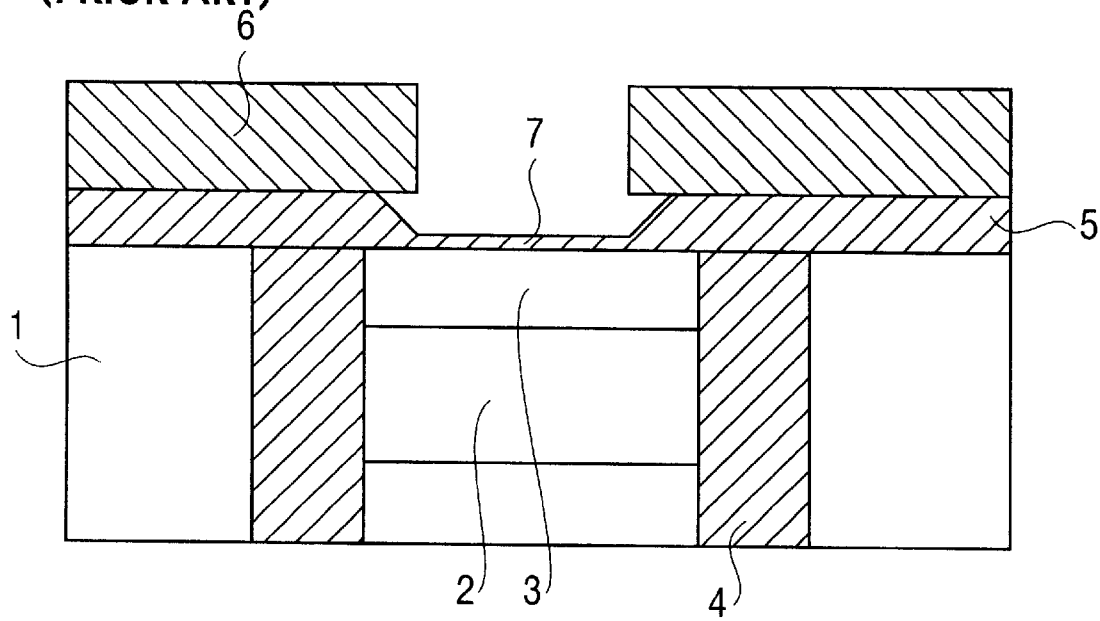
FIGS. 17 to 21 are cross sections showing the bipolar transistor fabricated according to the first related art.
Figure 18:
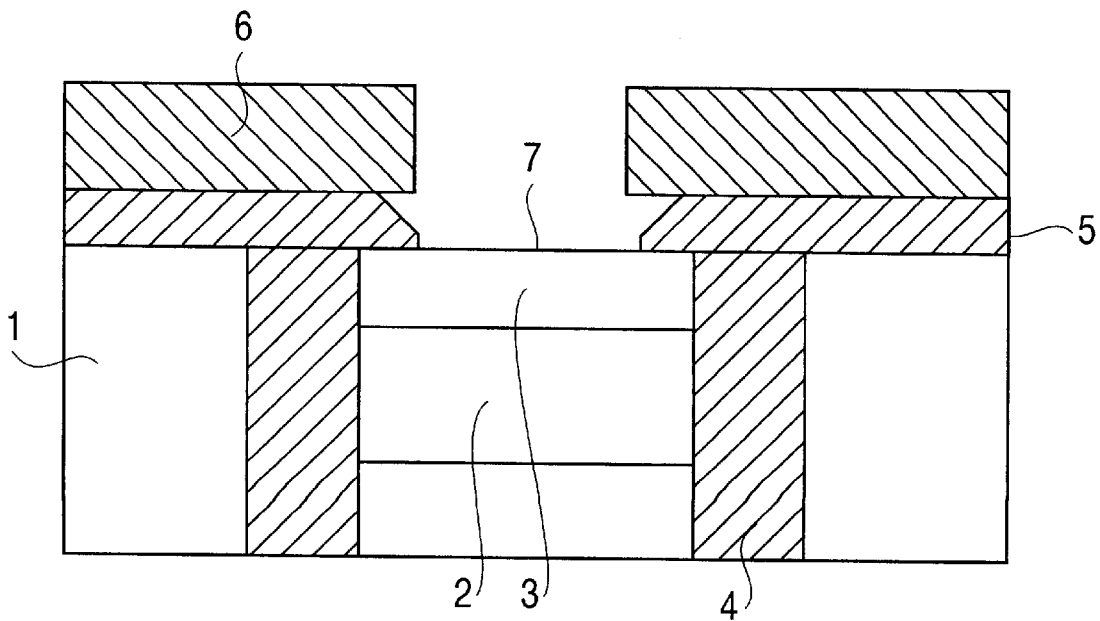
Figure 19:
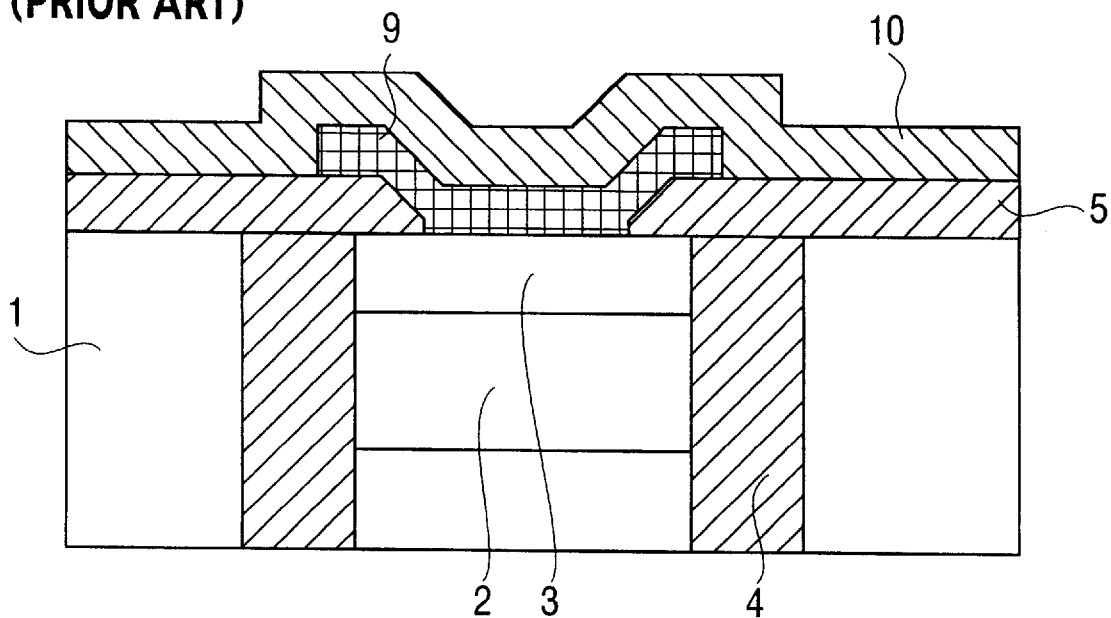
Figure 20:
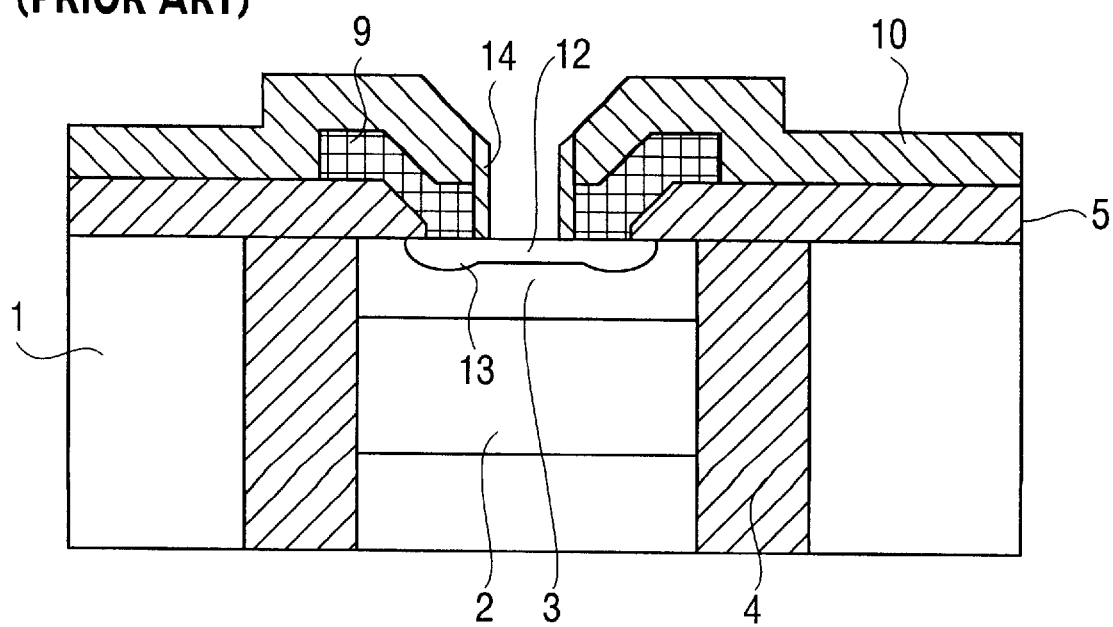
Figure 21:
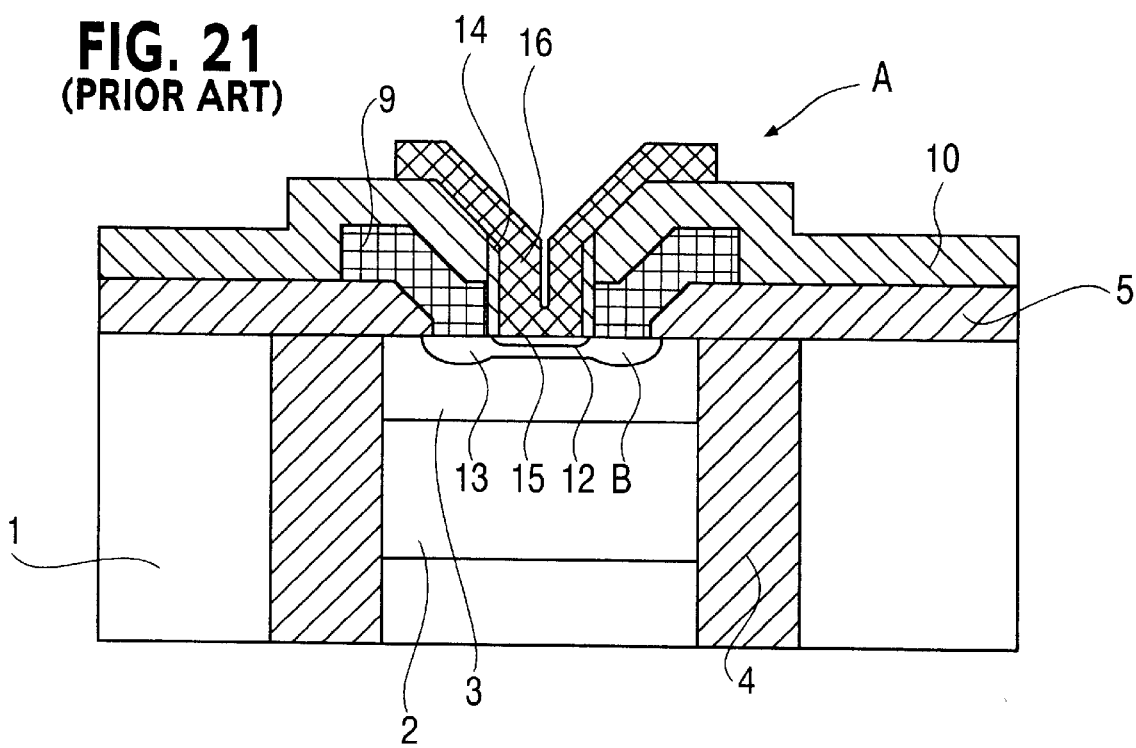
Figure 22:
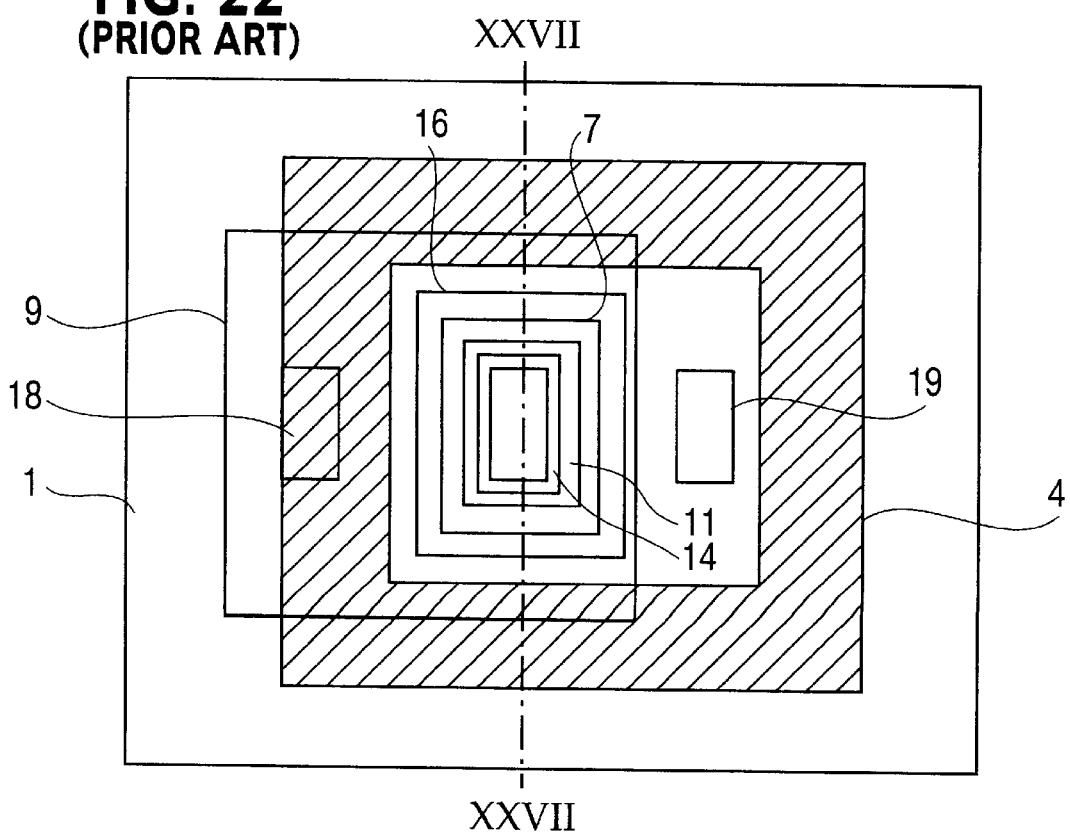
FIG. 22 is a plan view of a bipolar transistor according to the second related art.
Figure 23:
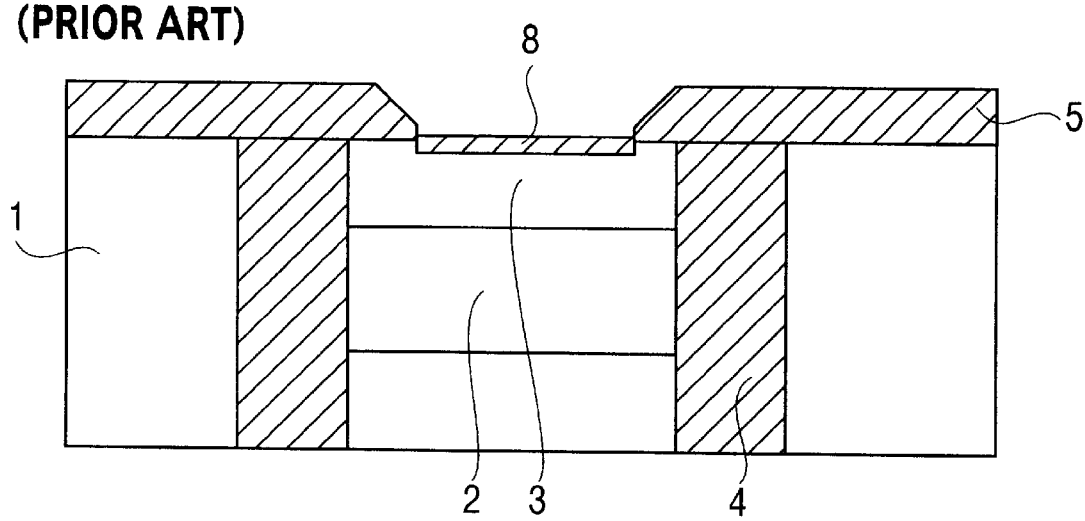
FIGS. 23 to 27 are cross sections showing a bipolar transistor fabricated according to the second related art.
Figure 24:
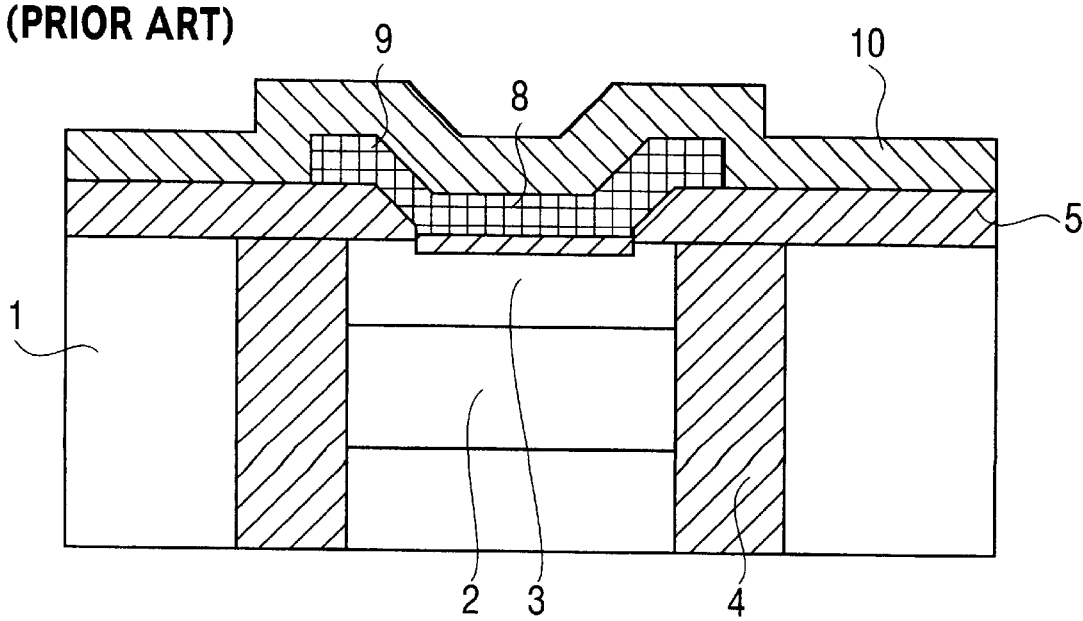
Figure 25:
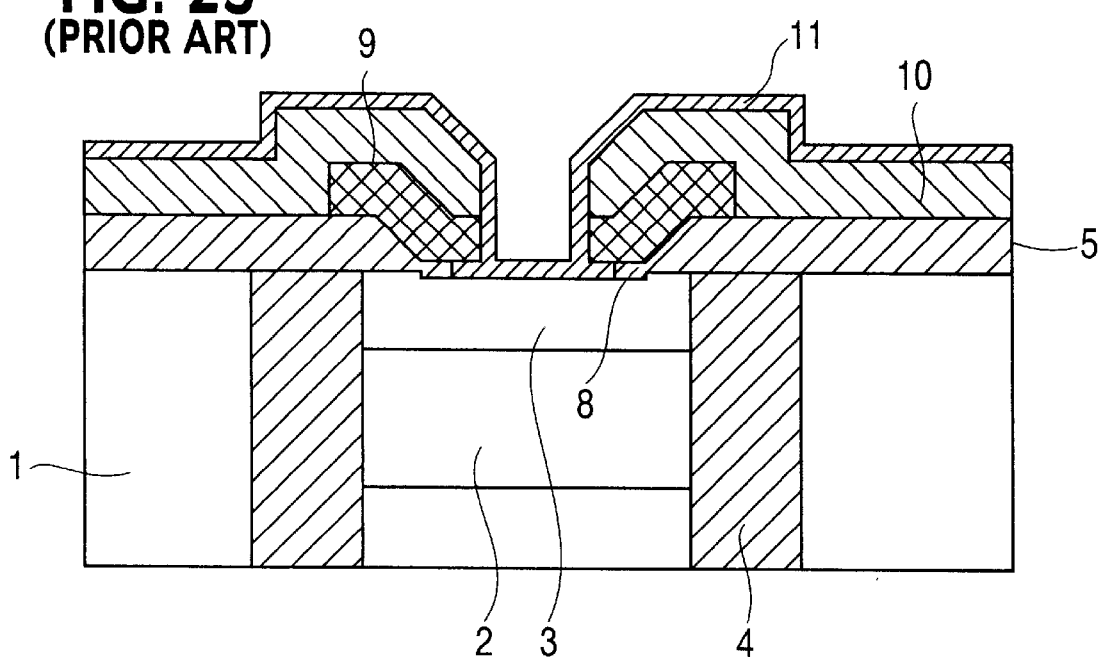
Figure 26:
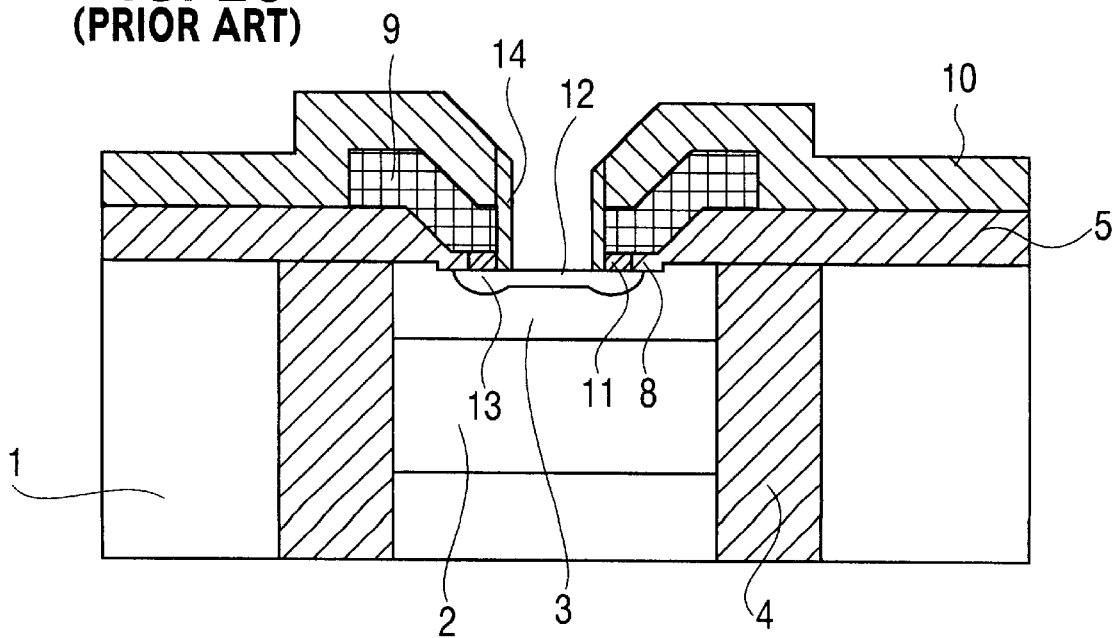
Figure 27:
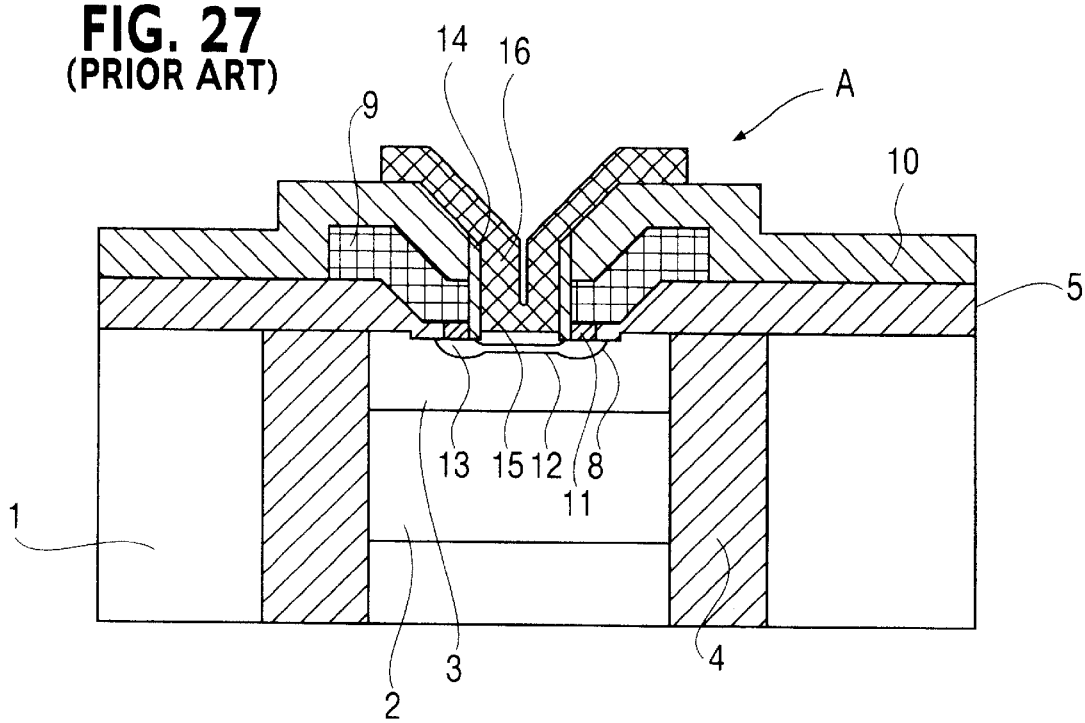
Figure 28:
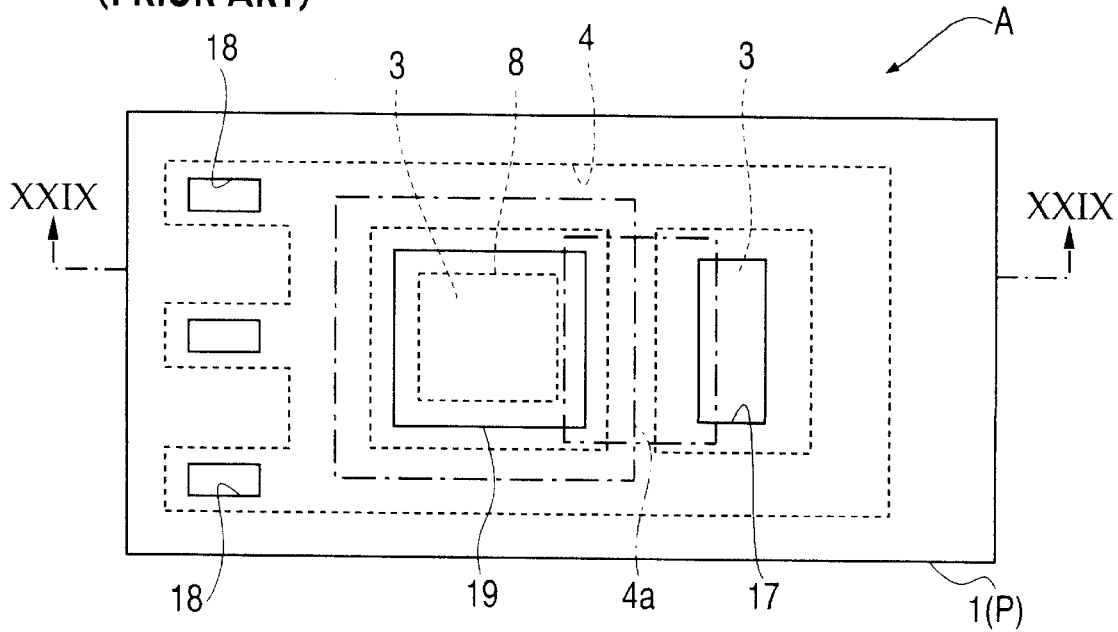
FIG. 28 is a plan view of a bipolar transistor according to the third related art.
Figure 29:
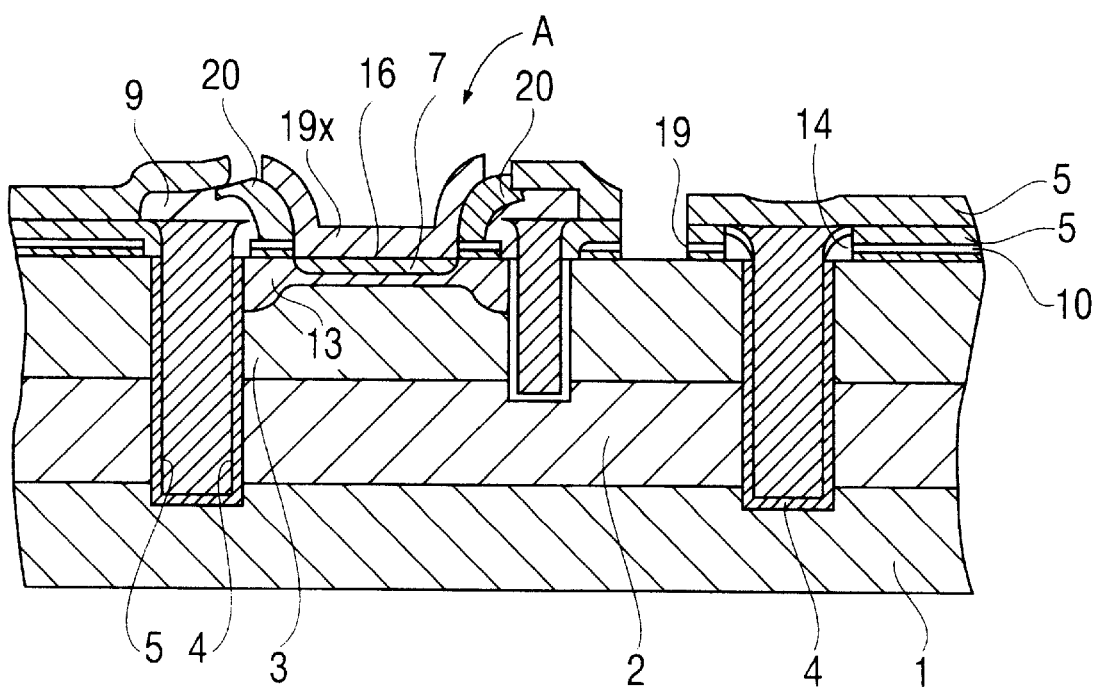
FIG. 29 is a cross section of a bipolar transistor according to the third related art.

Next, the third and the fourth embodiments of the invention will be explained with reference to FIG. 15. In the first and the second embodiments explained above, isolation between the devices was accomplished by using an isolation trench 4, whereas the isolation area in the third and the fourth embodiments, which is surrounding the transistor area A (that is, the so-called "field area"), is embedded in the dielectric layer 20 and leveled.

In this isolated structure, a lightly-doped n-type semiconductor layer 3, a highly-doped n-type semiconductor layer 2, and the upper surface of the p-type semiconductor substrate 1 of the area other than the transistor area B are selectively etched, forming a transistor area in the form of an island, and then the dielectric material is embedded in the field area using a dielectric layer 20 around the transistor area. The height of this so-called "island" is ordinarily about 3 to 5 microns, so the BPSG, etc., exhibiting the above reflow characteristics at high temperature is effective, in the view of the embedding of the isolation area with such a large step. The process is, after embedding the recessed part using low-pressure CVD, the sharp step formed by the dielectric materials deposited on the island structure will be smoothed, and the depth of the step will be decreased. After that, perfect planarization is performed using a decreased mechanical polishing method. In this process, it is necessary to cover the side of the transistor area using a thermally grown oxide or nitride layer in order to prevent the direct contact of the BPSG and the semiconductor surface. The above isolation structure can also be adopted if the interface between the dielectric layer and the transistor area is approximately perpendicular without a birds beak. Therefore, it is not necessary for the isolation area to use a trenched groove, which can be embedded by using a dielectric layer grown by a CVD method; it can instead be isolated by growing a dielectric layer on the area other than the transistor area, which is an island-form semiconductor area.

In this isolation structure, the same functions and the same effects as those in the first and second embodiments of the invention are expected as well. This is because parasitic capacitance can be further reduced due to the reduced dielectric constant around the area of the transistor area. Furthermore, as the thickness of the dielectric layer will be increased in the area under lines connecting between the transistors, the reduction of parasitic capacitance between lines and the substrate is possible. Thus, it is possible to realize a semiconductor device with improved MICROWAVE performance.

What is claimed is:

1. A semiconductor device comprising:
    a bipolar transistor formed in a transistor area; and
    an isolation area formed of dielectric material around the transistor area,
    said bipolar transistor further comprising a base area formed around an emitter area formed at a central area of the transistor area, and a base electrode contacting said base area;
    said isolation area further comprising a contact groove formed at an inner surface of the isolation area facing an outer surface of the transistor area, and wherein a part of said base electrode is embedded in said contact groove so that said base electrode contacts an upper surface of said base area and a lateral surface of said base area;
    wherein said contact groove is formed by etching said dielectric material to a constant depth and said part of said base electrode is formed by filling an electrode material in said contact groove; and
    wherein said base electrode contacts only said upper surface of said base area on one side of said base area, and contacts both said upper surface and said lateral surface of said base area on an other side of said base area.

2. A semiconductor device as recited in claim 1, wherein said isolation area is formed by filling said dielectric material in a trenched groove formed around said transistor area.

3. A semiconductor device according to claim 2, wherein a side wall of dielectric material is disposed between the outer surface of the transistor area and the base electrode in the bipolar transistor.

4. A semiconductor device according to claim 1, wherein a side wall of dielectric material is disposed between the outer surface of the transistor area and the base electrode in the bipolar transistor.

5. A bipolar transistor for use in a semiconductor device, said bipolar transistor comprising:

an emitter region formed in a transistor area of said bipolar transistor;

a base region formed in said transistor area of said bipolar transistor;

an isolation region formed of a dielectric material surrounding said transistor area for reducing parasitic capacitance between said bipolar transistor and other components formed on said semiconductor device;

an emitter electrode contacting at least an upper surface of said emitter region;

a base electrode having electrical contact with said base region;

wherein said isolation region includes a groove formed at an interior surface of said isolation region facing a lateral surface of said transistor area, and said groove is formed by etching said dielectric material to a constant depth;

wherein said base electrode is embedded in said groove to ensure electrical contact with said base region even under substrate shift conditions in fabrication of said semiconductor device; and wherein said base electrode contacts only an upper surface of said base region on one side of said base region, and contacts both said upper surface and a lateral surface of said base region on another side of said base region.

6. A bipolar transistor as recited in claim 5, wherein said base region further comprises an intrinsic base layer and a graft base layer, and wherein said base electrode is in electrical contact with said graft base layer.

7. A bipolar transistor as recited in claim 5, wherein a dielectric wall is formed between said base electrode and a portion of said lateral surface of said transistor area and an upper surface of said transistor area, and a width with which said base electrode contacts said transistor area is constant.

8. A bipolar transistor for use in a semiconductor device, said bipolar transistor comprising:

an emitter region formed in a transistor area of said bipolar transistor;

a base region formed in said transistor area of said bipolar transistor;

an isolation region formed of a dielectric material surrounding said transistor area for reducing parasitic capacitance between said bipolar transistor and other components formed on said semiconductor device;

an emitter electrode contacting at least an upper surface of said emitter region;

a base electrode having electrical contact with an upper surface and a lateral surface of said base region;

a spacer oxide layer disposed between a first portion of said base electrode and a portion of a lateral surface and an upper surface of said transistor area at one side of said transistor area and between a second portion of said base electrode and a portion of the lateral surface of said transistor area at another side of said transistor area; and a poly-Si layer disposed between a third portion of said base electrode and a portion of an upper surface of said transistor area at said one side of said transistor area and between a fourth portion of said base electrode and a portion of a lateral surface and an upper surface of said transistor area at said another side of said transistor area through which electrical contact with said base region is made;

wherein a groove is formed at an interior surface of said isolation region facing a lateral surface of said transistor area by etching said dielectric material to a constant depth, a lower part of said base electrode is embedded in said groove, and a width of said poly-Si layer with which said base electrode electrically contacts said transistor area is constant.

9. A bipolar transistor as recited in claim 8, wherein said base region further comprises an intrinsic base layer and a graft base layer, and wherein said base electrode is in electrical contact with said graft base layer.

* * * * *